(12) United States Patent
Saito et al.

(10) Patent No.: US 8,758,986 B2
(45) Date of Patent: Jun. 24, 2014

(54) PRINTED WIRING BOARD AND METHOD FOR PRODUCING THE SAME

(75) Inventors: Takeshi Saito, Tokyo (JP); Kazunori Kitamura, Tokyo (JP); Yukihiro Koga, Tokyo (JP)

(73) Assignee: San-Ei Kagaku Co., Ltd., Tokyo (JP)

( * ) Notice: Subject to any disclaimer, the term of this patent is extended or adjusted under 35 U.S.C. 154(b) by 169 days.

(21) Appl. No.: 12/874,755

(22) Filed: Sep. 2, 2010

(65) Prior Publication Data
US 2011/0132639 A1 Jun. 9, 2011

(30) Foreign Application Priority Data

Dec. 7, 2009 (JP) ................................. 2009-296026
Jun. 21, 2010 (JP) ................................. 2010-155224

(51) Int. Cl.
*G03F 7/26* (2006.01)

(52) U.S. Cl.
USPC .......................................... 430/319; 430/330

(58) Field of Classification Search
USPC .......................................... 430/319, 330, 311
See application file for complete search history.

(56) References Cited

U.S. PATENT DOCUMENTS 4,992,354 A * 2/1991 Axon et al. .................... 430/258
2008/0271912 A1 * 11/2008 Yoshida et al. ............... 174/250

FOREIGN PATENT DOCUMENTS

| JP | 11-112155 | | 4/1999 |
| JP | 2003-181918 | * | 7/2003 |
| JP | 2006-108163 | | 4/2006 |
| JP | 2006-114631 | | 4/2006 |
| JP | 2008-294406 | | 12/2008 |
| JP | 2009-217040 | | 9/2009 |
| TW | 2009-47125 | | 11/2009 |
| WO | 03005126 | | 1/2003 |

OTHER PUBLICATIONS

English Machine Translation, Hatakeyama, Apr. 23, 1999, JP 11-112155.*
DE Office Action dated Feb. 14, 2013, with English translation; Application No. DEA-46415.
Taiwanese Official Action—099129228—Nov. 12, 2013.

* cited by examiner

*Primary Examiner* — Caleen Sullivan
(74) *Attorney, Agent, or Firm* — Young & Thompson

(57) ABSTRACT

A method produces an undercoat-covered smoothed printed wiring board, requiring no step of polishing the surface of the printed wiring board. A method for producing a solder-resist-covered printed wiring board causes no depression in an area between circuit traces. A printed wiring board so produced is also described. The method for producing a printed wiring board includes applying a photo- and heat-curable resin composition onto at least a part of a surface of a printed wiring substrate; placing an optically transparent smoothing member on the resin layer; moving a hard roller on the smoothing member to thin the applied resin layer to a thickness of interest; placing a negative-image mask on the smoothing member; exposing the applied resin layer to light via the negative-image mask; removing the optically transparent smoothing member; removing a light-unexposed portion of the applied resin layer through development; and completely heat-curing the cured light-exposed portion.

7 Claims, 3 Drawing Sheets

PRINTED WIRING BOARD AND METHOD FOR PRODUCING THE SAME

The entire disclosure of Japanese Patent Applications No. 2009-296026 filed Dec. 7, 2009 and No. 2010-155224 filed on Jun. 21, 2010 is expressly incorporated by reference herein.

BACKGROUND OF THE INVENTION

1. Field of the Invention

The present invention relates to a method for producing a printed wiring board, and to a printed wiring board produced through the method. More particularly, the invention relates to a novel method for smoothing the surface of a printed wiring board, and to a smoothed printed wiring board produced through the smoothing method.

2. Background Art

Conventionally, solder-resist-covered printed wiring boards are produced through applying a photo- and heat-curable solder resist ink to the entire surface of a printed wiring substrate; exposing the solder resist ink layer to light via a negative-image mask for masking the circuit, to thereby cure the solder resist; removing the light-unexposed portion on the circuit through development; and completely curing the cured light-exposed portion. For example, Japanese Patent Application Laid-Open (kokai) No. 2008-294406 discloses such a process.

However, the printed wiring boards produced through such a conventional method generally have a drawback in that the surface of each printed wiring board in an area between circuit traces is depressed (see FIG. 3).

One approach for overcoming this drawback includes applying an undercoat ink onto the entire surface of the printed wiring substrate and curing the ink; polishing the cured undercoat layer until the circuit is exposed to thereby smooth the surface (see, for example, Japanese Patent Application Laid-Open (kokai) No. 2006-108163, FIG. 3); and applying the aforementioned conventional production method to the smoothed printed wiring substrate, to thereby produce a solder-resist-covered printed wiring board.

However, when this approach is employed, the circuit may be undesirably removed during surface polishing, resulting in damage and wear of the circuit. Furthermore, productivity problematically lowers due to addition of the surface-polishing step.

SUMMARY OF THE INVENTION

In view of the foregoing, an object of the present invention is to provide a method for producing an undercoat-covered smoothed printed wiring board, which method requires no step of polishing the surface of the printed wiring board. Another object of the present invention is to provide a method for producing a solder-resist-covered printed wiring board, which method causes no depression in an area between circuit traces. Still another object of the present invention is to provide a printed wiring board produced through such a method.

The present inventors have conducted extensive studies in order to attain the aforementioned objects, and have accomplished the present invention.

Accordingly, in a first aspect of the present invention, there is provided a method for producing a printed wiring board, which method comprises:

applying a photo- and heat-curable resin composition onto at least a part of a surface of a printed wiring substrate;

placing an optically transparent smoothing member on the applied resin layer;

moving a hard roller on the optically transparent smoothing member, to thereby thin the applied resin layer to a thickness of interest;

placing a negative-image mask on the optically transparent smoothing member;

exposing the applied resin layer to light via the negative-image mask;

removing the optically transparent smoothing member;

removing a light-unexposed portion of the applied resin layer through development; and completely heat-curing the cured light-exposed portion.

In the method of the present invention, the photo- and heat-curable resin composition may contain substantially no solvent and may be alkali developable.

In the method of the present invention, the photo- and heat-curable resin composition may comprise [I] an alkali-developable resin having an unsaturated group, [II] an acrylic monomer and/or a methacrylic monomer (hereinafter may be collectively referred to as "(meth)acrylic monomer"), [III] a photoreaction initiator, [IV] an epoxy compound, and [V] a heat-curing agent.

In the method of the present invention, the applied resin layer may be defoamed by heating or in vacuum, after application of the photo- and heat-curable resin composition.

In the method of the present invention, the hard roller may be made of metal.

In the method of the present invention, at least a part of the surface of the circuit, which surface has been covered with the applied resin layer, may be exposed by removing the light-unexposed portion through development.

In the method of the present invention, the printed wiring board may have a step between the surface of the completely cured resin layer and the exposed surface of the circuit of 5 µm or less.

In a second aspect of the present invention, there is provided a printed wiring board produced through any of the aforementioned methods.

According to the present invention, there can be provided a method for producing an undercoat-covered smoothed printed wiring board, which method requires no step of polishing the surface of the printed wiring board; a method for producing a solder-resist-covered printed wiring board, which method causes no depression in an area between circuit traces; and a printed wiring board produced through such a method.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
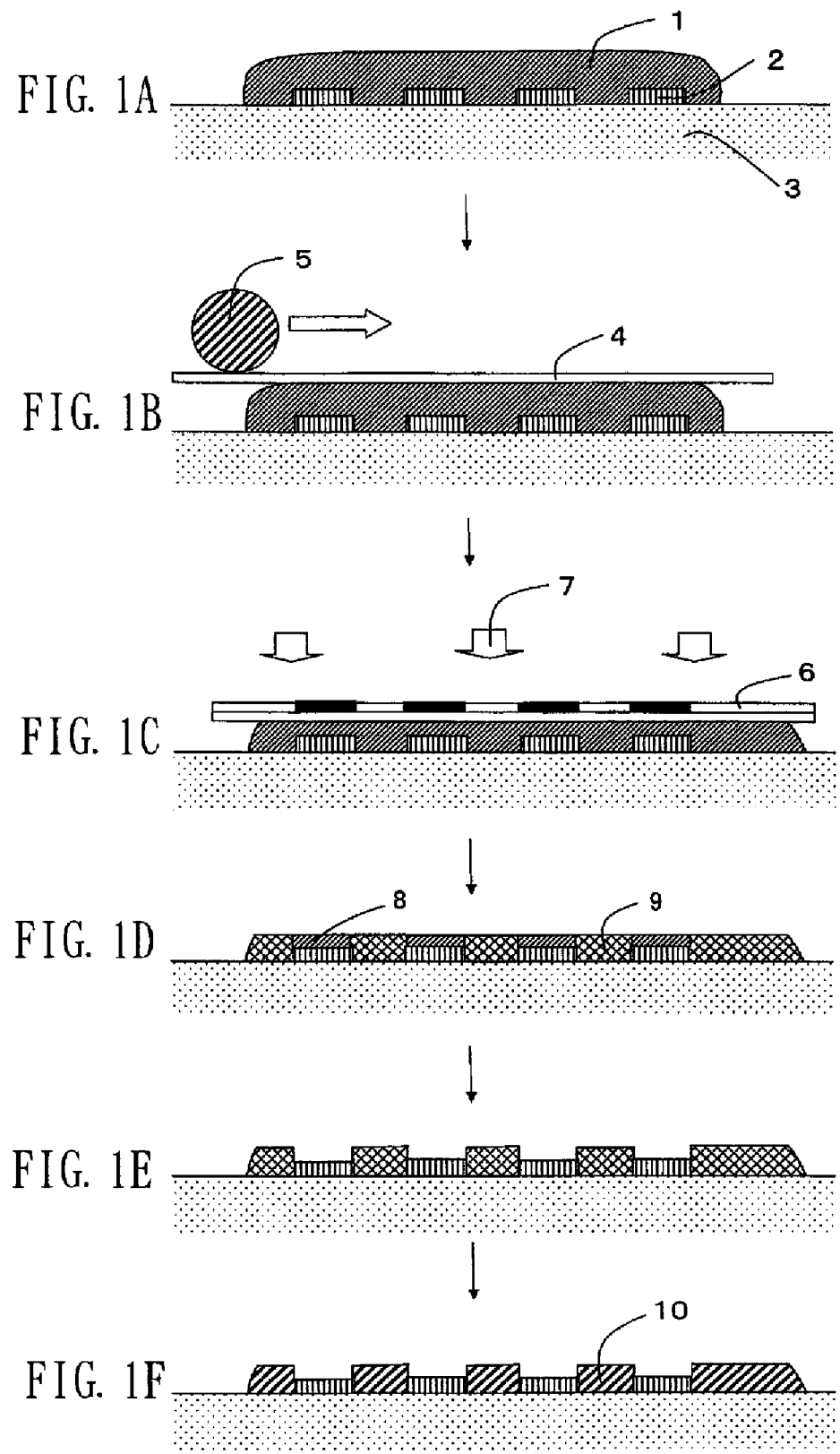
FIGS. 1A to 1F are cross-sections for visualizing the method for producing a printed wiring board of the present invention.

The best modes of the present invention will next be described in detail.

The method for producing a printed wiring board of the present invention employs an ink to be applied which is a photo- and heat-curable (photo/heat two-step curable type) resin composition. No particular limitation is imposed on the photo- and heat-curable resin composition, and any such resin compositions may be used. Among them, solvent-free resin compositions; i.e., resin compositions containing substantially no solvent, are preferred. When a solvent-containing resin composition is employed, the volume of the applied resin layer considerably varies during drying by evaporating the solvent, possibly generating depression in an area between circuit traces. Also, when a solvent-containing resin composition is employed, the viscosity of the resin contained in the applied resin layer increases after the drying by evaporating the solvent, possibly making the below-mentioned thinning difficult. From the environmental viewpoint, the photo- and heat-curable resin composition is preferably alkali developable; i.e., can be developed with aqueous alkali solution.

One embodiment of such a photo- and heat-curable resin composition is a resin composition comprising [I] an alkali-developable resin having an unsaturated group, [II] a (meth) acrylic monomer", [III] a photoreaction initiator, [IV] an epoxy compound, and [V] a heat-curing agent.

In the photo- and heat-curable resin composition, examples of resin [I] include resin [I-1] which has two or more ethylenic unsaturated groups and a carboxylic group and has a solid content acid value of 50 to 150 mgKOH/g.

Examples of resin [I-1] include resin [I-1-i] which is produced through esterification between (a) a polyfunctional epoxy resin having two or more epoxy groups and (b) an unsaturated monocarboxylic acid, and reaction between the hydroxyl group of the thus-esterified compound and (c) a saturated and/or unsaturated polybasic acid anhydride.

In the production of resin [I-1-i], specific examples of the polyfunctional epoxy resin (a) include bisphenol A-type epoxy resin, hydrogenated bisphenol A-type epoxy resin, bisphenol F-type epoxy resin, bisphenol S-type epoxy resin, phenol-novolak-type epoxy resin, cresol-novolak-type epoxy resin, bisphenol A-novolak-type epoxy resin, biphenol-type epoxy resin, bixylenol-type epoxy resin, trisphenolmethane-type epoxy resin, and N-glycidyl-type epoxy resin.

In the production of resin [I-1-i], examples of the unsaturated monocarboxylic acid (b) include a reaction product between acrylic acid, methacrylic acid, cinnamic acid, or saturated or unsaturated dibasic acid anhydride and a (meth) acrylate having one hydroxyl group in the molecule thereof.

In the production of resin [I-1-i], Examples of the saturated and/or unsaturated polybasic acid anhydride (c) include anhydrides of phthalic acid, tetrahydrophthalic acid, hexahydrophthalic acid, succinic acid, trimellitic acid, and pyromellitic acid.

Another example of resin [I-1] is resin [I-1-ii], which is produced through reaction of a copolymer of acrylic acid and/or methacrylic acid and another copolymerizable monomer (d) having an ethylenic unsaturated bond partially with glycidyl acrylate and/or glycidyl methacrylate and which has a weight average molecular weight of 5,000 to 20,000.

In the production of resin [I-1-ii], specific examples of the copolymerizable monomer (d) include styrene, chlorostyrene, and α-methylstyrene; acrylates or methacrylates having a substituent [methyl, ethyl, propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, or 3-chloro-2-hydroxypropyl]; polyethylene glycol monoacrylate or monomethacrylate, and polypropylene glycol monoacrylate or monomethacrylate; vinyl acetate, vinyl butyrate, and vinyl benzoate; acrylamide, methacrylamide, N-hydroxymethylacrylamide, N-hydroxymethylmethacrylamide, N-methoxymethylacrylamide, N-ethoxymethylacrylamide, and N-butoxymethylacrylamide; acrylonitrile; and maleic anhydride.

Yet another example of resin [I-1] is resin [I-1-iii], which is produced through reaction of a copolymer of glycidyl acrylate and/or glycidyl methacrylate and another copolymerizable monomer (d) with the unsaturated monocarboxylic acid (b), and reaction of the hydroxyl group of the reaction product with the saturated and/or unsaturated polybasic acid anhydride (c) and which has a weight average molecular weight of 5,000 to 20,000.

In the production of resin [I-1-iii], examples of the copolymerizable monomer (d), unsaturated monocarboxylic acid (b), and saturated and/or unsaturated polybasic acid anhydride (c) include those exemplified in relation to resin [I-1-i] and resin [I-1-ii].

In the photo- and heat-curable resin composition, specific examples of the (meth)acrylic monomer [II] include isobornyl acrylate, dicyclopentanyl methacrylate, hydroxypivalic acid neopentyl glycol diacrylate, tricyclodecanedimethanol acrylate, trimethylolpropane triacrylate, dipentaerythritol hexaacrylate, and isobornyl crotonate.

In the photo- and heat-curable resin composition, specific examples of the photoreaction initiator [III] include hydroxyketones such as benzyl dimethyl ketal, 1-hydroxy-cyclohexyl-phenyl ketone, and 2-hydroxy-2-methyl-1-phenylpropan-1-one; aminoketones such as 2-methyl-1[(4-methylthio) phenyl]-2-morpholinopropan-1-one, and 2-benzyl-2-dimethylamino-1-(4-morpholinophenyl)butanone-1; phosphine oxides such as 2,4,6-trimethylbenzoyl diphenylphosphine oxide and bis(2,4,6-trimethylbenzoyl)phenylphosphine oxide; benzoin ethers such as benzoin methyl ether and benzoin isobutyl ether; thioxanthones such as isopropylthioxanthone and 2-chlorothioxanthone; benzophenones such as benzophenone, 2-benzoylnaphthalene, 4-benzoylbiphenyl, 4-benzoyldiphenyl ether, and [4-(methylphenylthio)phenyl]phenylmethane; anthraquinones such as 2-ethylanthraquinone; biimidazoles such as 2,2'-bis(o-chlorophenyl)-4,5,4',5',-tetraphenyl-1,2'-biimidazole; acridones such as 10-butyl-2-chloroacridone; benzils; titanocene compounds such as Irgacure 784 (commercial product); and triarylpsulfonium-phosphorus hexafluoride (or antimony hexafluoride).

In the photo- and heat-curable resin composition, the epoxy compound [IV] preferably has two or more epoxy groups, and examples include such compounds which are soluble or hardly soluble in (meth)acrylic monomers. Specific examples of the epoxy compound [IV] include soluble epoxy compounds including epoxy compounds [bisphenol A-type epoxy resin, bisphenol F-type epoxy resin, N,N,O-tris(glycidyl)-p-aminophenol, and bisphenol AD-type epoxy resin (liquid epoxy resins) and novolak-type epoxy resin], and hardly soluble epoxy compounds [including triglycidyl isocyanurate-type, biphenyl-type (tetramethylbiphenyl-type), diphenyl-type [e.g., di-(p-glycidylphenyl) ether], hydroquinone-type (e.g., hydroquinone diglycidyl ether), biphenyl novolak-type, and fluorene-type (crystalline epoxy resins)].

In the photo- and heat-curable resin composition, specific examples of the heat-curing agent [V] include dicyan diamides (DICY), melamine, imidazoles, BF3-amine complex, amine-adduct-type curing agents, amine-acid anhydride (polyamide) adduct-type curing agents, hydrazide curing agents, and amine curing agents (carboxylate salts, onium salts, etc.).

The photo- and heat-curable resin composition may further contain, as additives, an anti-halation agent, a defoaming agent, a filler, a leveling agent, a thixotropy-imparting agent, an organic/inorganic colorant, and a flame retardant.

The photo- and heat-curable resin composition preferably has the following compositional proportions: ingredient [II] in an amount of 50 to 400 (particularly 100 to 300) parts by weight, ingredient [III] in an amount of 1 to 20 (particularly 5 to 15) parts by weight, ingredient [IV] in an amount of 10 to 100 (particularly 50 to 80) parts by weight, and ingredient [V] in an amount of 1 to 20 (particularly 5 to 10) parts by weight, with respect to 100 parts by weight of ingredient [I].

Hereinafter, the method for producing a printed wiring board of the present invention will be described with reference to FIG. 1. In the method for producing a printed wiring board of the present invention, firstly, a photo- and heat-curable resin composition 1 is applied onto at least a part of (i.e., entirely or partially) the surface of a printed wiring substrate 3. Preferably, the composition is applied onto the surface of the circuit traces 2 (FIG. 1A). The composition may be applied through, for example, screen printing. The thickness of the coating layer on the surface of the circuit traces 2 is preferably, for example, 20 to 50 μm (particularly preferably 5 to 30 μm).

Subsequently, the applied resin layer is preferably defoamed through heating (e.g., at 80 to 120° C. for 30 to 120 minutes) or in vacuum, whereby bubbles entrained into the resin during application are removed.

Then, an optically transparent smoothing member 4 is placed (preferably closely) on the applied resin layer. Preferably, the smoothing member 4 allows transmission of the irradiation light as described hereinbelow, has a smooth surface on at least one side thereof (preferably on both sides), and can be readily removed through peeling (as described hereinbelow). Specific examples of the smoothing member 4 include films (PET film, etc.), sheets, and plates. Of these, a film form is preferred. The film preferably has a thickness of, for example, 10 to 100 μm.

On the smoothing member 4, a hard roller 5 is moved (FIG. 1B). Specifically, the hard roller 5 is pressed against the smoothing member 4 at a pressure of 0.1 to 1 MPa and is moved with rotation at 0.5 to 2 m/min. Through employment of the hard roller 5, depression of the surface of the printed wiring board in an area between circuit traces can be prevented. The hard roller 5 preferably has a Vicker's hardness equal to or higher than that of the material of the circuit. Specific examples of the material of the hard roller 5 include metals (e.g., stainless steel, iron, aluminum, and copper). Of these, stainless steel is preferred. The roller diameter is preferably, for example, 5 to 250 mm.

Through movement of the roller, the applied resin layer is squeezed and thinned to a thickness of interest. More specifically, in the case where the applied resin layer is employed as an undercoat layer, the layer on the circuit is thinned to a thickness of, for example, 5 μm or less (preferably 3 μm or less, more preferably 1 μm or less), whereas in the case where the applied resin layer is employed as a solder resist layer, the layer on the circuit is thinned to a thickness of, for example, 5 to 25 μm (preferably 5 to 15 μm, more preferably 8 to 12 μm).

Then, a negative-image mask 6 is placed (preferably closely) on the smoothing member. The mask pattern masks the circuit such that an opening for establishing a pad electrode is formed and, therefore, is preferably designed such that a pad electrode pattern of interest (pad diameter, pad pitch, etc.) can be attained.

Then, the applied resin layer is irradiated with light via the negative-image mask 6. Specifically, light is applied from the upper side of the negative-image mask 6 (FIG. 1C). In one exemplary case, the resin layer is irradiated with light 7 having a wavelength of 300 to 450 nm at a dose of 10 to 200 mJ/cm$^2$.

After light exposure, the smoothing member is peeled off from the printed wiring substrate (FIG. 1D). In this case, the negative-image mask may be removed in advance from the smoothing member or may remain placed on the smoothing member.

Then, a light-unexposed portion 8 of the applied resin layer is removed through development (FIG. 1E), and, if required, the surface of the printed wiring substrate is washed with, for example, water. The developer is preferably an aqueous alkali developer (e.g., aqueous sodium carbonate solution). Through development, the light-unexposed portion 8 is removed, and the surface of the circuit substrate is exposed. Thus, at least a part of the circuit surface can be exposed, to thereby form an opening for establishing a pad electrode. The opening for a pad electrode may be formed on the circuit surface partially or entirely.

Then, a cured light-exposed portion 9 of the applied resin layer is completely cured by heating (10) (FIG. 1F). The heating may be performed at 130 to 200° C. for 30 to 180 minutes.

Through the above process, the printed wiring board of the present invention is produced.

Figure 2:
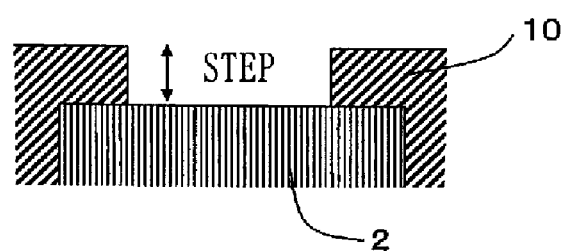
FIG. 2 is a partially enlarged cross-sectional view of the "step" between the surface of the completely cured resin layer and the exposed surface of the circuit.
Figure 3:
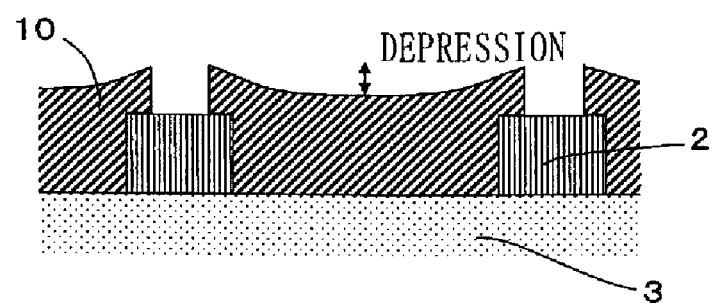
FIG. 3 is a partially enlarged cross-sectional view of the "depression" in an area between circuit traces in the surface of the wiring board.

In the method for producing a printed wiring board of the present invention, as described above, the applied resin layer can be thinned to a thickness of interest. Therefore, the step between the surface of the completely cured resin layer and the exposed surface of the circuit (FIG. 2) can be adjusted to a value of interest falling within a range of, for example, about 0 to about 25 μm.

Figure 4:
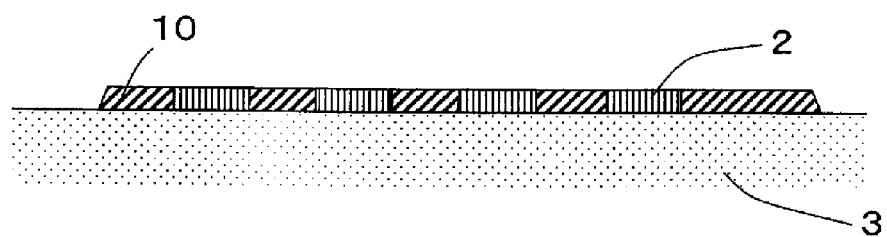
FIG. 4 is a cross-sectional view of a completely cured resin (i.e., undercoat)-covered smoothed printed wiring board having substantially no step.

More specifically, through adjusting the step between the surface of the completely cured resin layer and the exposed surface of the circuit to 5 μm or less (preferably 3 μm or less, more preferably 1 μm or less), a completely cured resin (i.e., undercoat)-covered smoothed printed wiring board having substantially no step can be produced (FIG. 4).

Figure 5:
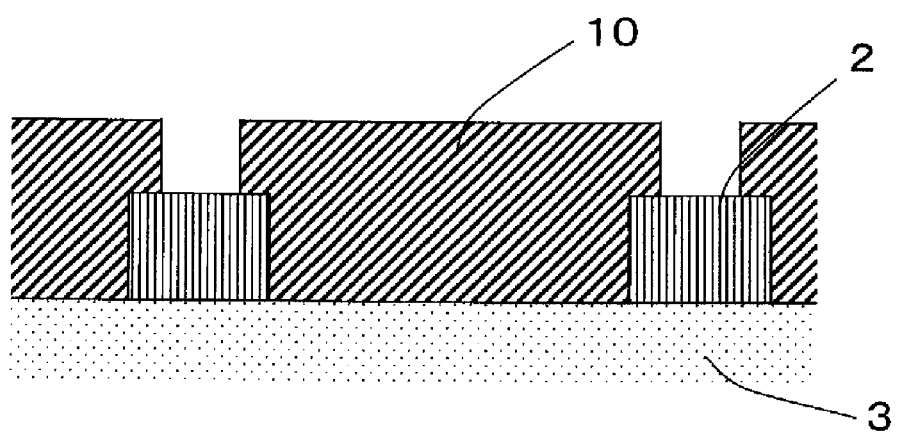
FIG. 5 is a cross-sectional view of a completely cured resin (i.e., solder resist)-covered smoothed printed wiring board having no depression in an area between circuit traces.

Also, through adjusting the step between the surface of the completely cured resin layer and the exposed surface of the circuit to 5 to 25 μm (preferably 5 to 15 μm, more preferably 8 to 12 μm), a completely cured resin (i.e., solder resist)-covered smoothed printed wiring board having substantially no step in an area between circuit traces can be produced (FIGS. 1F, 5).

EXAMPLES

The present invention will next be described in detail by way of examples, which should not be construed as limiting the invention thereto.

<Production of Undercoat-Covered Smoothed Printed Wiring Board>

Example 1

Composition of undercoat ink A (parts by weight): Resin A [a resin produced through reaction of tetrahydrophthalic anhydride with a reaction product between cresol-novolak-type epoxy resin and acrylic acid, acid value: 70 mgKOH/g] (100); trimethylolpropane triacrylate (170), hydroxyethyl acrylate (30), Irgacure OXE02 [photoreaction initiator, product of Ciba Specialty Chemicals] (5), diethylthioxanthone (1), silicone oil (1), dicyan diamide (5), talc (50), silica micropowder (200), Epikote 828 [bisphenol A-type epoxy resin] (20), and Epikote YX-4000 [tetramethylbiphenyl-type epoxy resin] (40).

Undercoat ink A was applied through screen printing to a circuit portion of a printed wiring substrate (coating thickness on the circuit: 15 μm).

Subsequently, the thus-coated printed wiring substrate was placed in a box-type drier and heated at 80° C. for 30 minutes.

Then, a PET film (thickness: 17 μm) was closely placed on the undercoat layer.

A stainless steel roller (roller diameter: 10 mm) was pressed against the PET film at 0.5 MPa and moved at 1.0 m/min with rotation on the PET film, whereby the undercoat layer was thinned so as to have a thickness on the circuit of ≤2 μm.

Then, a negative-image mask was closely placed on the PET film.

The undercoat layer was irradiated with light through the negative-image mask (wavelength: 365 nm, dose: 30 mJ/cm$^2$).

While the negative-image mask remained placed, the PET film was removed from the surface of the undercoat layer.

The surface of the printed wiring substrate was developed with 1 wt % aqueous sodium carbonate solution and washed with water, whereby openings for establishing pad electrodes were formed in the circuit.

The thus-processed printed wiring substrate was placed in a box-type drier and heated at 150° C. for one hour.

The thus-produced printed wiring board (Example 1) was observed under a scanning electron microscope (SEM) (×500). The step between the surface of the undercoat layer and the exposed surface of the circuit was found to be 2 μm or less, indicating that a substantially smoothed printed wiring board was obtained. Furthermore, there was no damage on the pad portions of the circuit.

Example 2

Composition of undercoat ink B (parts by weight): Resin A [a resin produced through reaction of tetrahydrophthalic anhydride with a reaction product between triphenylmethane-type epoxy resin and acrylic acid, acid value: 90 mgKOH/g] (100); dipentaerythritol hexaacrylate (150), hydroxyethyl acrylate (50), Irgacure 907 [photoreaction initiator, product of Ciba Specialty Chemicals] (5), diethylthioxanthone (1), silicone oil (1), melamine (10), talc (50), barium sulfate (200), Epikote 828 [bisphenol A-type epoxy resin] (20), and Epikote YX-4000 [tetramethylbiphenyl-type epoxy resin] (40).

The procedure of Example 1 was repeated, except that undercoat ink B was used instead of undercoat ink A, to thereby produce a printed wiring board.

The thus-produced printed wiring board (Example 2) was observed under a scanning electron microscope (SEM) (×500).

The step between the surface of the undercoat layer and the exposed surface of the circuit was found to be 2 μm or less, indicating that a substantially smoothed printed wiring board was obtained. Furthermore, there was no damage on the pad portions of the circuit.

Comparative Example 1

Undercoat ink A was applied through screen printing to a circuit portion (copper layer thickness: 24 μm) of a printed wiring substrate (coating thickness on the circuit: 15 μm).

Subsequently, the thus-coated printed wiring substrate was placed in a box-type drier and heated at 80° C. for 30 minutes.

The entire surface of the resin-coated layer was irradiated with light (wavelength: 365 nm, dose 30 mJ/cm$^2$).

The thus-processed printed wiring substrate was placed in a box-type drier and heated at 150° C. for one hour.

The surface of the cured undercoat layer formed on the circuit was polished by means of a buff until the thickness of the layer on the circuit was adjusted to ≤2 μm.

The thus-produced printed wiring board (Comparative Example 1) was observed under a scanning electron microscope (SEM) (×500). No step was found between the surface of the undercoat layer and the exposed surface of the circuit. However, there was considerable damage on the circuit traces in the pad portions, and the copper layer thickness was reduced by 8 μm.

<Production of Solder-Resist-Covered Printed Wiring Board>

Example 3

Composition of solder resist ink (parts by weight): Resin A [a resin produced through reaction of tetrahydrophthalic anhydride with a reaction product between cresol-novolak-type epoxy resin and acrylic acid, acid value: 70 mgKOH/g] (100), trimethylolpropane triacrylate (150), hydroxyethyl acrylate (50), Irgacure 907 [photoreaction initiator, product of Ciba Specialty Chemicals] (1), silicone oil (1), melamine (8), talc (50), silica micropowder (200), Epikote 828 [bisphenol A-type epoxy resin] (20), and Epikote YX-4000 [tetramethylbiphenyl-type epoxy resin] (36).

The solder resist ink was applied through screen printing to a circuit portion of a printed wiring substrate (coating thickness on the circuit: 30 μm).

Subsequently, the thus-coated printed wiring substrate was placed in a box-type drier and heated at 80° C. for 30 minutes.

Then, a PET film (thickness: 17 μm) was closely placed on the solder resist ink layer.

A stainless steel roller (roller diameter: 10 mm) was pressed against the PET film at 0.5 MPa and moved at 1.0 m/min with rotation on the PET film, whereby the solder resist layer was thinned so as to have a thickness on the circuit of 20 μm.

Then, a negative-image mask was closely placed on the PET film.

The solder resist layer was irradiated with light through the negative-image mask (wavelength: 365 nm, dose: 200 mJ/cm$^2$).

While the negative-image mask remained placed, the PET film was removed from the surface of the solder resist layer.

The surface of the printed wiring substrate was developed with 1 wt % aqueous sodium carbonate solution and washed with water, whereby openings for establishing pad electrodes were formed in the circuit.

The thus-processed printed wiring substrate was placed in a box-type drier and heated at 150° C. for one hour.

The thus-produced printed wiring board (Example 3) was observed under a scanning electron microscope (SEM) (×500). The maximum depth of the depression of the surface of the printed wiring board was found to be ≤3 μm, and the step between the surface of the solder resist layer and the exposed surface of the circuit was found to be 20 μm.

Comparative Example 2

The solder resist ink was applied through screen printing to a circuit portion of a printed wiring substrate (coating thickness on the circuit: 30 μm).

Subsequently, the thus-coated printed wiring substrate was placed in a box-type drier and heated at 80° C. for 30 minutes.

Then, a negative-image mask was on the printed wiring substrate, and the solder resist layer was irradiated with light through the negative-image mask (wavelength: 365 nm, dose: 100 mJ/cm$^2$).

Then, the negative-image mask was removed from the surface of the solder resist layer.

The surface of the printed wiring substrate was developed with 1 wt % aqueous sodium carbonate solution and washed with water, whereby openings for establishing pad electrodes were formed in the circuit.

The thus-processed printed wiring substrate was placed in a box-type drier and heated at 150° C. for one hour.

The thus-produced printed wiring board (Comparative Example 2) was observed under a scanning electron microscope (SEM) (×500). The maximum depth of the depression of the surface of the printed wiring board was found to be 35 μm.

What is claimed is:

1. A method for producing a printed wiring board, comprising:
    applying a photo- and heat-curable liquid resin composition onto at least a part of a surface of a printed wiring substrate such that the thickness of the composition on circuit traces is from 5 to 30 μm;
    placing an optically transparent smoothing member on the applied resin layer;
    moving a hard, metal roller on the optically transparent smoothing member, to thereby thin the applied resin layer to a thickness of interest while causing no depression on the applied resin layer;
    placing a negative-image mask on the optically transparent smoothing member;
    exposing the applied resin layer to light via the negative-image mask;
    removing the optically transparent smoothing member;
    removing a light-unexposed portion of the applied resin layer through development; and
    completely heat-curing the cured light-exposed portion.

2. A method for producing a printed wiring board according to claim 1, wherein the photo- and heat-curable resin composition comprises [I] an alkali-developable resin having an unsaturated group, [II] a (meth)acrylic monomer, [III] a photoreaction initiator, [IV] an epoxy compound, and [V] a heat-curing agent.

3. A method for producing a printed wiring board according to claim 1, wherein the applied resin layer is be defoamed by heating or in vacuum, after application of the photo- and heat-curable resin composition.

4. A method for producing a printed wiring board according to claim 1, wherein at least a part of the surface of the circuit, which surface has been covered with the applied resin layer, is exposed by removing the light-unexposed portion through development.

5. A method for producing a printed wiring board according to claim 4, wherein the printed wiring board has a step between the surface of the completely cured resin layer and the exposed surface of the circuit of 5 μm or less.

6. The method according to claim 1, wherein the thickness of interest is 5 μm or less.

7. The method according to claim 1, wherein the liquid resin composition is an ink resin composition.

* * * * *